United States Patent [19]

Liu et al.

[11] Patent Number: 5,502,403
[45] Date of Patent: Mar. 26, 1996

[54] HIGH SPEED CONFIFURATION INDEPENDENT PROGRAMMABLE MACROCELL

[75] Inventors: Lin-Shih Liu, Fremont; Syed B. Raza, Sunnyvale; Hagop Nazarian, San Jose, all of Calif.; George M. Ansel, Starkville, Miss.; Stephen M. Douglass, Saratoga, Calif.; Jeffery S. Hunt, Ackerman, Miss.

[73] Assignee: Cypress Semiconductor Corp., San Jose, Calif.

[21] Appl. No.: 360,469

[22] Filed: Dec. 20, 1994

[51] Int. Cl.$^6$ .................. H03K 19/173; H03K 19/0948
[52] U.S. Cl. ............................... 326/46; 326/40; 326/50; 326/97; 327/203
[58] Field of Search ........................ 326/38–40, 44–45, 326/49–50, 46, 95–98, 17; 327/202–203, 218

[56] References Cited

U.S. PATENT DOCUMENTS 4,870,302  9/1989  Freeman ..................... 326/45
5,225,724  7/1993  Scarra et al. ................ 327/203
5,426,380  6/1995  Rogers ........................ 326/46

*Primary Examiner*—Edward P. Westin
*Assistant Examiner*—Jon Santamauro
*Attorney, Agent, or Firm*—Blakely, Sokoloff, Taylor & Zafman

[57] ABSTRACT

A user configurable circuit contains clock logic, a switching element and a data path circuit. Input data is received in the switching element, and the switching element and the data path circuit constitute the entire data path for the circuit. A plurality of user configurable inputs are received to configure the circuit for a particular user application. The clock logic and the switching element implement a logic function that is configurable by the user configurable inputs. The logic function is pre-processed in the clock logic so that minimal delay occurs in the data path. In addition, the propagation delay through the switching element and the register is independent of the user configurable inputs. The user configurable circuit of the present invention has application for use as a macro cell for a programmable logic device permitting the user to configure the circuit as a D-type flip-flop, a T-type flip-flop. In addition, the user selects the polarity for the output circuit.

19 Claims, 5 Drawing Sheets

HIGH SPEED CONFIFURATION INDEPENDENT PROGRAMMABLE MACROCELL

FIELD OF THE INVENTION

The present invention relates to the field of programmable logic devices, and more particularly to a high speed programmable macro cell with a propagation delay independent of the configuration.

BACKGROUND OF THE INVENTION

In general, programmable logic devices (PLDs) permit a user to configure the PLD device to accommodate a wide spectrum of applications. One type of PLDs has a programmable macro cell. The programmable macro cell provides the capability of defining the architecture of each output individually. Each of the potential outputs may be specified to be "registered" or "combinatorial". In addition, the polarity of each output may also be individually selected allowing complete flexibility of the output configuration. In addition, further configurability is provided through "array" configurable "output enable" for each potential output. This feature allows the outputs to be reconfigured as inputs on an individual basis, or alternatively, used as a combinational I/O controlled by the programmable array. An example of such a PLD device is manufactured by Cypress Semiconductor Corporation, the Assignee of the present invention.

FIG. 1 illustrates a user configurable macro cell configured in accordance with the prior art. For the circuit illustrated in FIG. 1, the user selects the configuration of the macro cell to operate as either a D-type flip-flop or a T-type flip-flop. In addition, the user selects the polarity of the output data (e.g. whether the output of the circuit is selected from the register true (Q) or bar ($\overline{Q}$)). Typically, the user selects the configuration by programming user configurable bits. In response to the user configurable bits, a D-type, a T-type, a polarity, $\overline{Dtype}$, a $\overline{Ttype}$ and $\overline{polarity}$ select signals are generated. A macrocell 100 receives the D-type, T-type, polarity, $\overline{Dtype}$, $\overline{Ttype}$ and $\overline{polarity}$ select signals.

The macro cell circuit 100 contains an exclusive OR gate (XOR) 102, a register 120, and a plurality of transmission gates 105, 110, 152 and 154. The XOR gate 102 implements the toggle function for the T-type flip-flop. As is shown in FIG. 1, transmission gates 105, 110, 115, 125, 140, 148, 154 and 152 contain a p channel metal oxide semiconductor (MOS) transistor and an n channel MOS transistor. The register 120, used to implement the D-type and the T-type flip-flops, contains a master latch, a slave latch and a transmission gate 140 used to couple the master latch and the slave latch. The master latch includes inverters 130 and 135, as well as transmission gate 125. The slave latch includes inverters 145 and 1.46, as well as transmission gate 148.

The "Data In" is input to the XOR 102 and a transmission gate 105. If a D-type flip-flop is specified by the static control signals, then the transmission gate 105 conducts the "data in" signal to a transmission gate 115. If the static control signals specify a T-type flip-flop, then the output of the XOR gate 102 is coupled to the transmission gate 115 via the transmission gate 110.

During a clock transition from a high state to low logic state, the data input to transmission gate 115 is passed to the master latch. Also, during the high state to low logic state transition, the transmission gates 125 and 140 are disabled, and the transmission gate 148 is enable to latch or retain the state previously latched in the slave latch. When the clock cycle transitions to a high logic level, the transmission gate 140 and the transmission gate 125 are enable to latch the data in the master latch, and to pass the data into the slave latch, inverters 145 and 146. In addition, in the high clock cycle, the transmission gate 148 is disabled. The polarity and polarity static signals select either the true or bar outputs of the register 120 to generate the "data out".

Although the macro cell circuit 100 provides selectable D-type or T-type configurations, the T-type configuration requires a longer set-up time than the D-type configuration due to the XOR gate 102. In addition, the data path for the D-type configuration includes transmission gate 105, and the data path for the T-type configuration includes transmission gate 110. Furthermore, whether the T-type or D-type configurations are selected, the data is further delayed by the transmission gates 152 and 154 utilized to select the polarity.

SUMMARY AND OBJECTS OF THE INVENTION

Therefore, it is an object of the present invention to reduce the propagation delay of the data path in a user configurable circuit.

It is another object of the present invention to provide a high speed user configurable circuit, wherein the propagation delays are independent of the configuration.

These and other objects are included in a circuit that contains clock logic, a switching element and a data path circuit. Input data is received in the switching element, and the switching element and the data path circuit constitute the entire data path for the circuit. A plurality of user configurable inputs are received to configure the circuit for a particular user application. The clock logic and the switching element implement a logic function that is configurable by the user configurable inputs. The logic function is preprocessed in the clock logic so that minimal delay occurs in the data path. In addition, the propagation delay through the switching element and the data path circuit is independent of the user configurable inputs.

The clock logic receives the user configurable inputs and a clock input. In turn, the clock logic generates conditional clock signals to implement the logic function for the circuit based on the clock input and the user configurable inputs. The switching element includes at least one transmission gate that is controlled by the conditional clock signals. The transmission gate includes any type of pass gate, such as a three state inverter or a switching transistor. The switching element generates a logic output, in accordance with the conditional clock signals, to implement the logic function by controlling propagation of the input signal through the transmission gate. The data path circuit receives the logic output, and is also controlled by the conditional clock signals.

The circuit of the present invention has application for use as a macro cell for a programmable logic device. In one embodiment, the data path circuit is a storage element, and the user configurable inputs include a D-type register select, a T-type resister select, a latch select, and a polarity select. The logic functions implemented in the clock logic are a multiplexer function, for selecting among a D-type flip-flop, a T-type flip-flop and a latch, and a polarity function for generating a true or a bar output for the circuit. The storage element is configured as a master/slave flip-flop, and includes a master latch, that receives the logic output, and a slave latch that couples the master latch to the circuit output.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Figure 1:
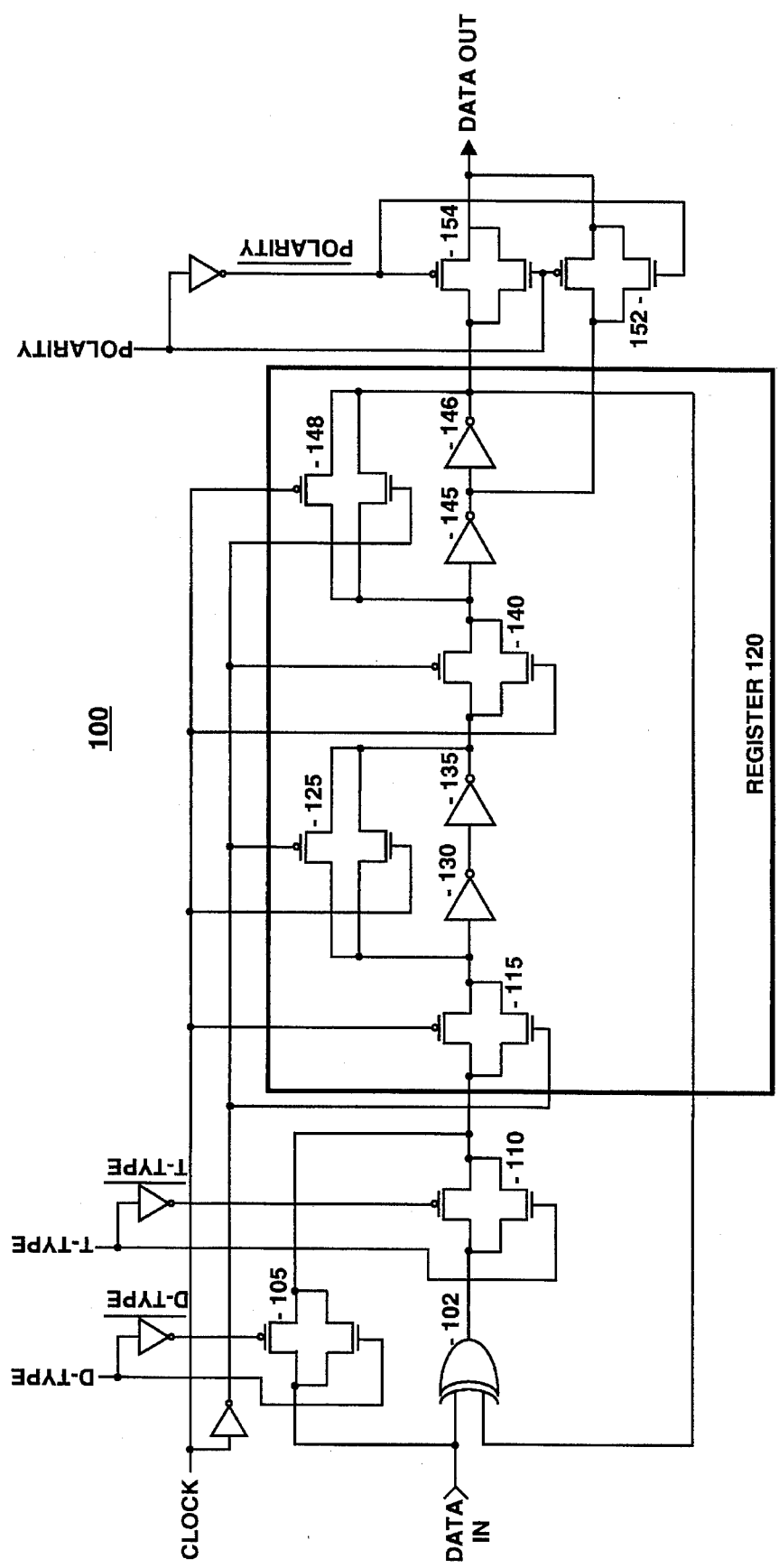
FIG. 1 illustrates a user configurable macro cell configured in accordance with the prior art.
Figure 2:
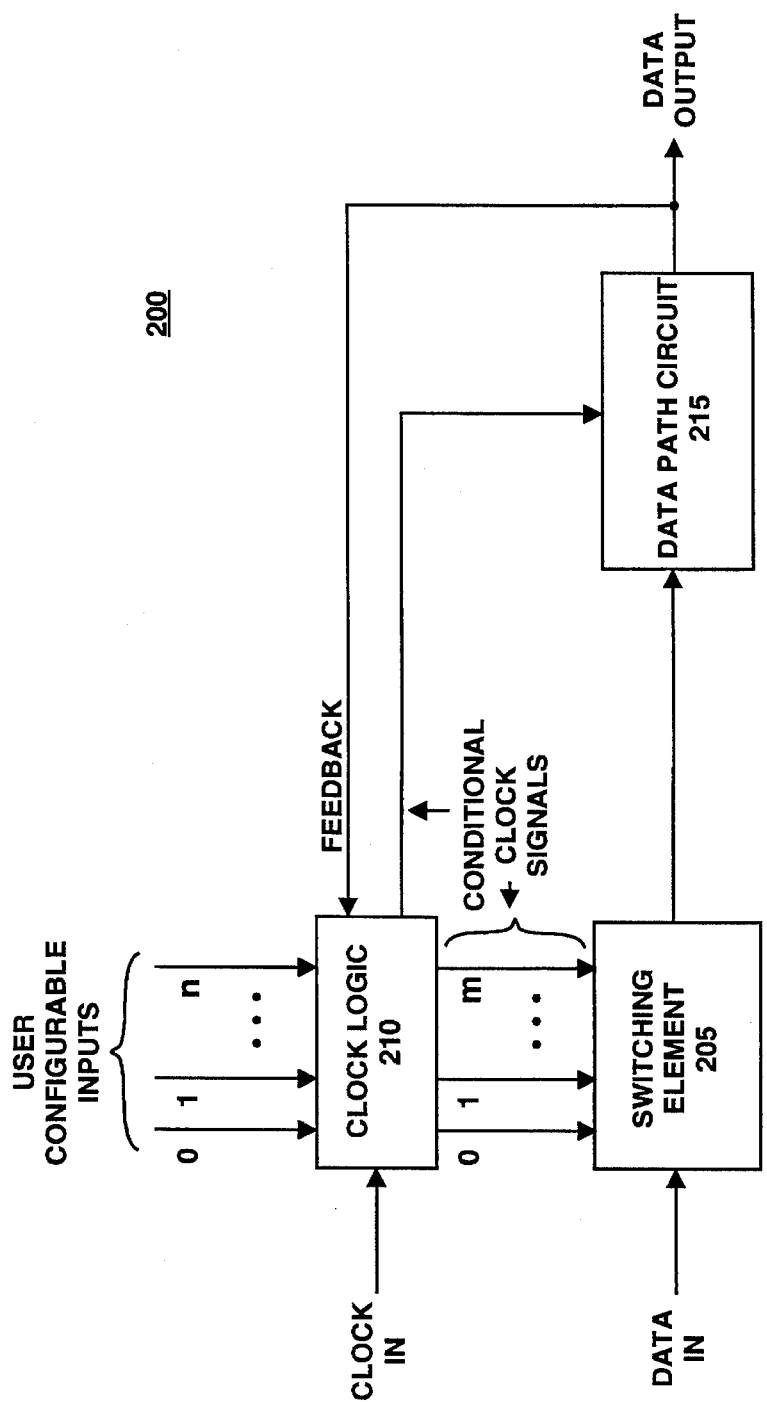
FIG. 2 is a high level block diagram illustrating the user configurable circuit of the present invention.

FIG. 2 is a high level block diagram illustrating the user configurable circuit of the present invention. A user configurable circuit 200 receives, as inputs, a plurality of user configurable inputs. For purposes of explanation, the user configurable circuit 200 receives "0–n" user configurable inputs. The user configurable circuit 200 contains clock logic 210, a switching element 205, and a data path circuit 215. The user configurable circuit 200 also receives a clock signal, at the "clock in" terminal, that provides timing for the circuit. Although the present invention is described in conjunction with a clock signal, any dynamic control signal used to gate input data may be used without deviating from the spirit and scope of the invention. Data is input to the switching element 205 at the "data in" terminal.

The clock logic 210 receives both the plurality of user configurable inputs, and the clock. In a preferred embodiment, the user configurable inputs are set or programmed by the user in an initialization period. Specifically, the user configurable inputs are programmed into a non-volatile memory, thereby storing user configurable bits in a PLD application. In the preferred embodiment, the user configurable bits are stored in an electrically erasable programmable read only memory (EEPROM). In an alternative embodiment, the user configurable inputs may be stored in a register, such as a serial shift register or a static random access memory (SRAM). After the initialization period, and upon powering of the user configurable circuit 200, the user configurable inputs do not change state, and therefore are characterized as pseudo DC signals. The circuitry utilized to set the user configurable input during the initialization period is well known in the art and will not be described further. The clock logic 210 generates conditional clock signals, labeled as conditional clock signals 0–m on FIG. 2.

The switching element 205 receives the conditional clock signals "0–m" and the data input. In general, the clock logic 210 and the switching element 205 implement at least one logic function for the user configurable circuit 200. For example, the clock logic 210 and the switching element 205 may implement a multiplexing function to select among three configurations such as a D-Type flip flop, T-type flip-flop and latch. The output of the switching element 205 is coupled to the input of data path circuit 215. The data path circuit 215 may comprise any type of circuit, such as a registered or combinational, used to implement the user configurable circuit. One embodiment for the data path circuit 215 is described more fully below. The output of data path circuit 215 is labeled "data output" on FIG. 2. The output of data path circuit 215 is also coupled to the clock logic 210 to provide implementation of certain flip flop functions.

In one embodiment, the switching element 205 gates the data input with the clock to provide synchronous operation between the input data and the data path circuit 215. In a preferred embodiment, the switching element 205 contains at least one gating or pass gate element, such as a transmission gate. However, the transmission gate may include any type of pass gate, such as a three state inverter or a switching transistor, without deviating from the spirit or scope of the invention. One embodiment for gating the input data in the switching element 205 is described more fully below. The conditional clock signals, generated in the clock logic 210, are utilized to gate the input data in the switching element 205.

The switching element 205 and the data path circuit 215 constitute the data path for the user configurable circuit 200, and the clock logic 210 provides the clock path for the user configurable circuit 200. Consequently, the critical path for reducing delay of the user configurable circuit 200 lies in the data path (e.g. data being propagated through the switching element 205 and data path circuit 215) and the clock path. In general, the user configurable circuit 200 is constructed such that most of the processing to implement the logic function or logic functions are done prior to an active clock (e.g. in the clock logic 210). Because the user configurable inputs are available as pseudo DC signals after power-up, most of the processing for the logic function occurs prior to receiving data for input to the data path. Also, because the operation of the data path circuit 215 requires gating the data, no additional delay is introduced to implement the logic function or logic functions in the switching element 205. Because of the decrease in gates in the data path, propagation delay through the user configurable circuit 200 is reduced.

Figure 3:
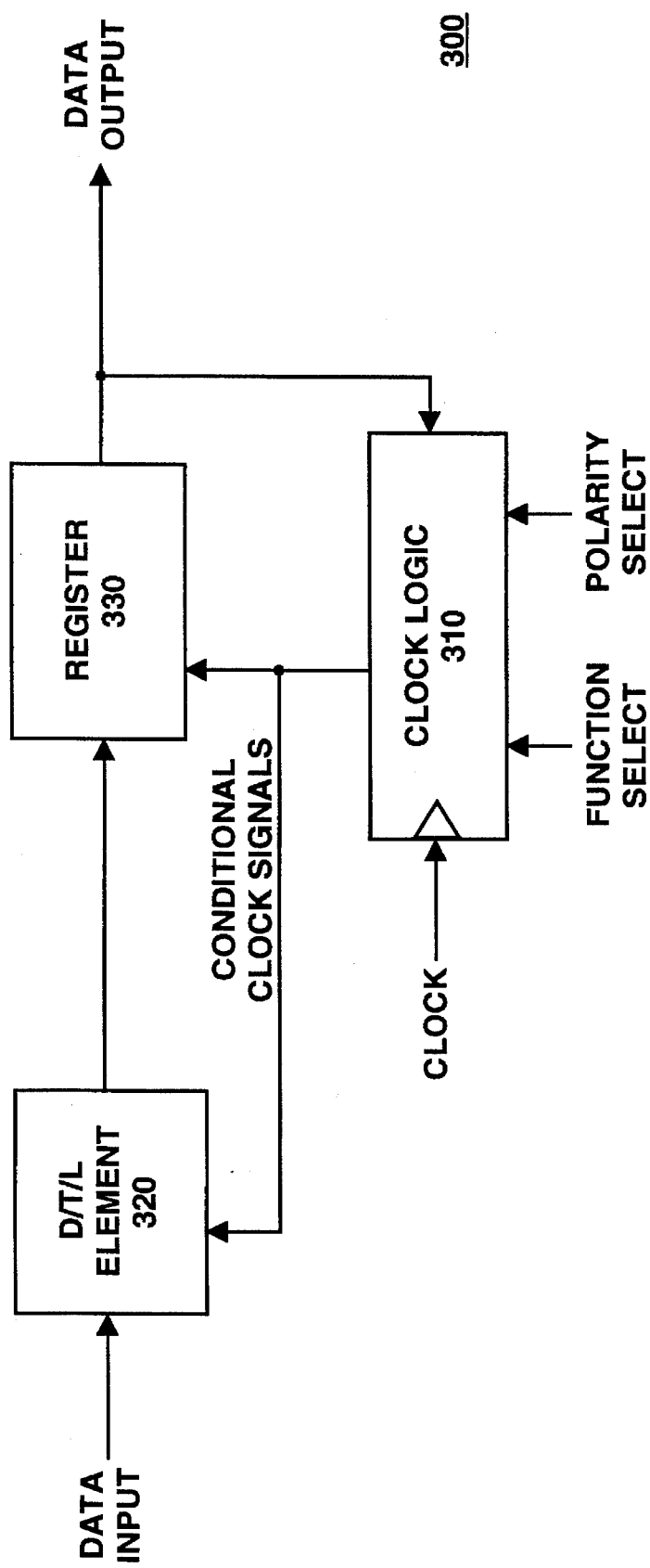
FIG. 3 is a block diagram illustrating a user configurable circuit configured in accordance with the present invention.

FIG. 3 is a block diagram illustrating a user configurable circuit configured in accordance with the present invention. In general, a user configurable circuit 300 permits a user to select among configuring the circuit as a D-type flip-flop, a T-type flip-flop or a latch. In addition, the user configurable circuit 300 permits a user to select the polarity of the data output. The user configurable circuit 300 contains clock logic 310, D-type flip-flop/T-type flip-flop/latch logic (D/T/L) element 320 and a register 330. The clock logic 310 receives function select and polarity select signals as user configurable inputs. In turn, the clock logic 310 generates conditional clock signals for the D/T/L element 320 and the register 330.

In general, the clock logic 310 and the D/T/L element 320 executes the toggle function, the polarity function, and a multiplexing function to select among the T-type flip-flop, the D-type flip-flop or latch configuration. The data input is received in the D/T/L element 320. The D/T/L element 320 is coupled to the register 330, and the data are output from the register 330. The data output are also input to the clock logic 310 in order to implement the T-type flip-flop function.

During a configuration period for the user configurable circuit 300, the function select and the polarity select signals are set. After the user configurable circuit 300 is powered up, the clock logic 310 generates the conditional clock signals in accordance with the function select and polarity select signals and the clock signal. During the rising edge of the clock, the data input are gated in the D/T/L element 320 in accordance with the conditional clock signals. The propagation delay in the D/T/L element 320 is equal to the propagation delay from one transmission gate. During the failing edge of the clock, data are latched in the register 330. The control of the data through the register 330 is also conducted by the conditional clock signals.

Figure 4:
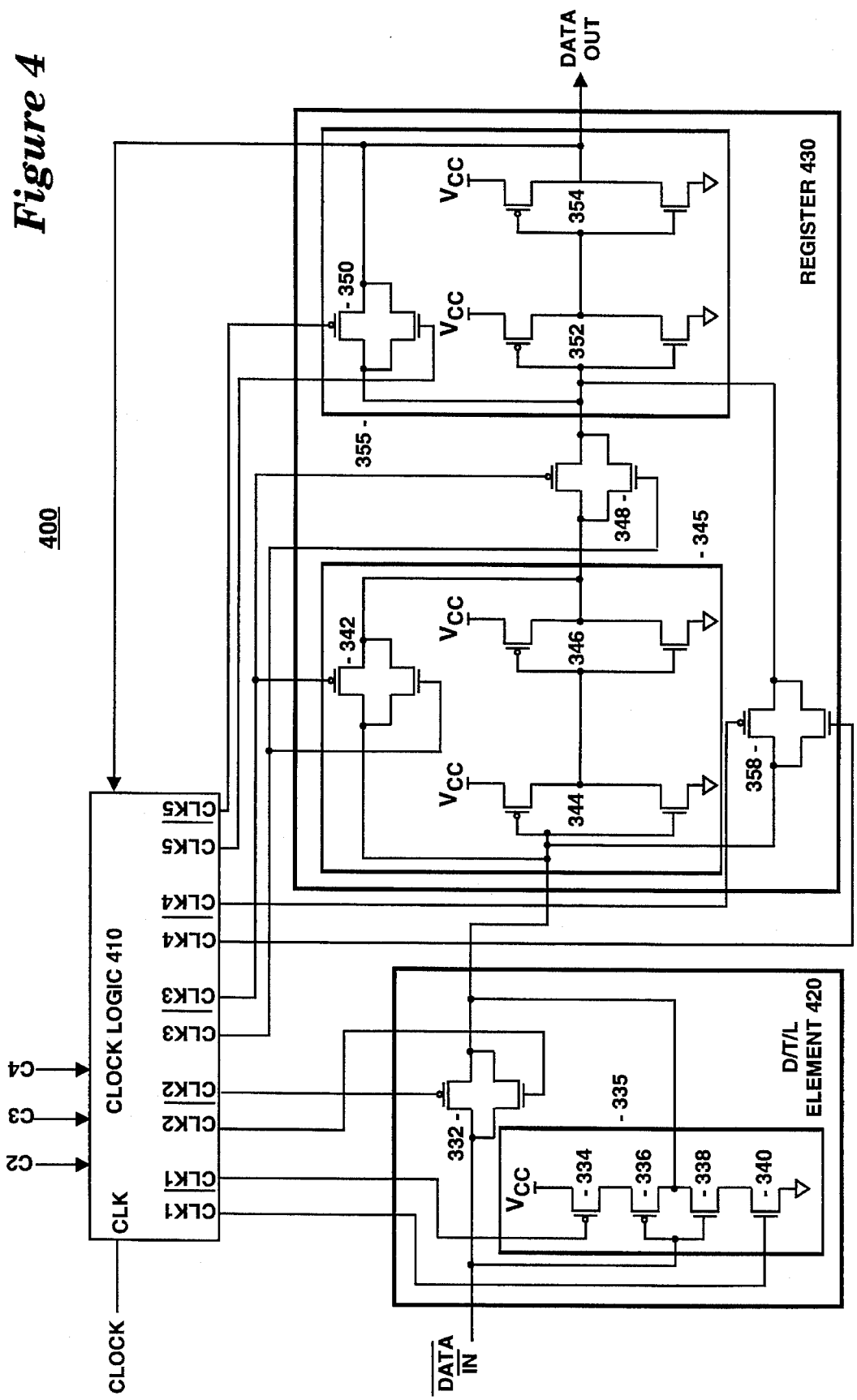
FIG. 4 illustrates one embodiment for implementing the user configurable circuit 300 illustrated in FIG. 3.

FIG. 4 illustrates one embodiment for implementing the user configurable circuit 300 illustrated in FIG. 3. A user configurable circuit 400 implements the D/T/L element 320 with a D/T/L element 420, the clock logic 310 with clock logic 410, and the register 330 with register 430. The D/T/L element 420 contains a three state inverter 335 and a transmission gate 332. The three state inverter 335 includes a CMOS inverter comprising p channel transistor 336 and n channel transistor 338. The three state inverter 335 further includes p channel transistor 334 coupled between the source of p channel transistor 336 and Vcc, and an n channel transistor 340 coupled between the source of n channel transistor 338 and ground. The register 430 contains a master latch 345 and a slave latch 355. The master latch 345 includes inverters 344 and 346, and a transmission gate 342. The slave latch 355 comprises inverters 352 and 354, and a transmission gate 350. The register 330 further includes a transmission gate 348 coupling the master latch with the slave latch.

As discussed above in conjunction with FIG. 3, the user configurable input defines the function selected, either the D-type flip-flop, T-type flip-flop or latch, and the polarity output from the circuit. As shown in FIG. 4, the clock logic 410 receives user configurable bits C2, C3, and C4. As discussed above, the user configurable bits C2, C3, and C4 are programmed during an initialization period, and are stored in non-volatile memory or registers. The clock logic 410 also receives the clock input. The clock logic 410 generates clock 1 (CLK 1), clock 1 bar ($\overline{\text{CLK1}}$), clock 2 (CLK 2), clock 2 bar ($\overline{\text{CLK2}}$), clock 3 (CLK 3), clock 3 bar ($\overline{\text{CLK3}}$), clock 4 (CLK 4), clock 4 bar ($\overline{\text{CLK4}}$), clock 5 (CLK 5), and clock 5 bar ($\overline{\text{CLK5}}$) signals.

The CLK 1 and $\overline{\text{CLK1}}$ signals control the enabling of the three state inverter 335, and the CLK 2 and $\overline{\text{CLK2}}$ signals control the transmission gate 332. The $\overline{\text{CLK3}}$ signal controls the p channel transistors in transmission gates 342 and 348, and the CLK 3 signal controls the n channel transistors in transmission gates 342 and 348. The $\overline{\text{CLK4}}$ signal controls the p channel transistor in transmission gate 358, and the CLK 4 signal controls the n channel transistor in transmission gate 358. In addition, the $\overline{\text{CLK5}}$ signal controls the p channel transistor in transmission gate 350, and the CLK 5 signal controls the n channel transistor in transmission gate 350.

In operation, data are input to the D/T/L element 420 on the $\overline{\text{Data In}}$ line. If the configurable circuit 300 is operating in the D-type flip-flop mode, and the polarity select indicates a bar output, then the CLK 1 and $\overline{\text{CLK1}}$ signals disable the three state inverter 335, and the CLK 2 and $\overline{\text{CLK2}}$ signals toggles the transmission gate 332. For the embodiment illustrated in FIG. 4, the bar output is Data Out. If the function select indicates a D-type flip-flop and the polarity select indicates a true output, then the CLK 1 and $\overline{\text{CLK1}}$ signals toggles the three state inverter 335 to pass data from the $\overline{\text{Data In}}$ to the output of the D/T/L element 420, and the CLK 2 and $\overline{\text{CLK2}}$ signals disable the transmission gate 332. Therefore, the D-type select and the polarity functions are primary implemented in the clock logic 310. Consequently, only one gate delay occurs in the D/T/L element 420 (e.g. either through the three state inverter 335 or the transmission gate 332).

As shown in FIG. 4, the output of the register 430 is coupled to the clock logic 410 to implement the T-type flip-flop function. In the T-type mode, the data output is toggled when the $\overline{\text{Data In}}$ is a low logic level, and the data output is not toggled when the $\overline{\text{Data In}}$ is a high logic level. Consequently, knowledge of the current state stored in the slave latch 355 is required to implement the T-type flip-flop function. If $\overline{\text{Data In}}$ is "0", and the slave latch 355 stores a "1", and the T-type function select is active, then CLK 1 and $\overline{\text{CLK1}}$ signals disable the three state inverter 335, and the CLK 2 and $\overline{\text{CLK2}}$ signals enable the transmission gate 332 to pass a low logic level. If the T-type function select is active, $\overline{\text{Data In}}$ is "0", and the slave latch 355 stores a "0", then the CLK 1 and $\overline{\text{CLK1}}$ signals enable the three state inverter 335, and the CLK 2 and $\overline{\text{CLK2}}$ signals disable the transmission gate 332, thereby coupling the output of three state inverter 335 to the register 430.

If the T-type select function is active, the $\overline{\text{Data In}}$ is "1", and the slave latch 355 stores a "0", then the CLK 1 and $\overline{\text{CLK1}}$ signals enable the three state inverter 335, and the CLK 2 and $\overline{\text{CLK2}}$ signals disable the transmission gate 332. However, if the T-type select is active, $\overline{\text{Data In}}$ is "1", and the slave latch 355 stores a "1", then the CLK 1 and $\overline{\text{CLK1}}$ signals disable the three state inverter 335, and the CLK 2 and $\overline{\text{CLK2}}$ signals enable the transmission gate 332.

When the user configurable circuit 400 is operating in the latch mode, the $\overline{\text{Data In}}$ is passed directly to the register 430. Therefore, for operation in the latch mode with bar output, the CLK 1 and $\overline{\text{CLK1}}$ signals disable the three state inverter 335, and the CLK 2 and $\overline{\text{CLK2}}$ signals enable the transmission gate 332 independent of the clock signal. For latch mode with true output, CLK2 and $\overline{\text{CLK2}}$ disable transmission gate 332 and CLK1 and $\overline{\text{CLK1}}$ signals enable three state inverter 335 independent of clock signal. Regardless of the true or bar output, when operating in the latch mode, transmission gate 358 is enabled with the CLK 4 and $\overline{\text{CLK4}}$ signals to bypass the master latch.

In the rising edge of the clock, data is passed from the $\overline{\text{Data In}}$ to the output of the D/T/L element 420 as described above, and the data is latched in the master latch 345 when operating in both the T-type and D-type modes. When the user configurable circuit 400 is operating in the latch mode, the CLK 4 and $\overline{\text{CLK4}}$ signals enable the transmission gate 358 to pass data from the output of the D/T/L element 420 to the slave latch 355. In all modes of operation, the data is latched in the slave latch 355 and the data is output from the master latch 345 during the falling edge of the clock.

For the user configurable circuit 400, the user configurable bits are C2, C3 and C4, and define the configuration of the circuit (e.g. toggle mode, latch mode, and polarity select). Specifically, the user configurable bits C2, C3 and C4 define the operation of the user configurable circuit 400 as follows:

$$\text{Treg} = \text{TOGGLEMODE} = \overline{C3} \cdot C2$$

C4=POLARITY ACTIVE HIGH $$\text{Latch} = \text{LATCHMODE} = C3 \cdot \overline{C2}$$

As shown in FIG. 4, the clock logic 410 generates the conditional clock signals CLK 1, $\overline{\text{CLK1}}$, CLK 2, $\overline{\text{CLK2}}$, CLK 3, $\overline{\text{CLK3}}$, CLK 4, $\overline{\text{CLK4}}$, CLK 5, $\overline{\text{CLK5}}$. The conditional clock signals are generated in the clock logic 410 based on the following relationships:

$$CLK1 = X \cdot \overline{Clk} + Latch \cdot C4$$

$$CLK2 = Y \cdot \overline{Clk} + Latch \cdot \overline{C4}$$

$$CLK3 = Clk \cdot \overline{Latch}$$

CLK4=Clk·Latch

CLK5=$\overline{\text{Clk}}$

Where

Clk=CLOCK

Slave=FEEDBACK FROM THE SLAVE REGISTER 355

AND

X=Treg·$\overline{\text{Slave}}$+$\overline{\text{Treg}}$·C4

Y=Slave·Treg+$\overline{\text{Treg}}$·$\overline{\text{C4}}$

The equations may be implemented using well known circuits. Table 1 below provides a truth table corresponding to the equations above.

TABLE 1

| Clock Cycle | Slave | C4 | C3 | C2 | Clkb | Clk1 | Clk2 | Clk3 | Clk4 | Clk5 |
|---|---|---|---|---|---|---|---|---|---|---|
| 0 | 0 | 0 | 0 | 0 | 0 | 0 | 0 | 1 | 0 | 0 |
| 1 | 0 | 0 | 0 | 0 | 0 | 0 | 0 | 1 | 0 | 0 |
| 2 | 0 | 0 | 0 | 0 | 1 | 0 | 1 | 0 | 0 | 1 |
| 3 | 0 | 0 | 0 | 1 | 0 | 0 | 0 | 1 | 0 | 0 |
| 4 | 0 | 0 | 0 | 1 | 1 | 1 | 0 | 0 | 0 | 1 |
| 5 | 0 | 0 | 1 | 0 | 0 | 0 | 1 | 0 | 1 | 0 |
| 6 | 0 | 0 | 1 | 0 | 1 | 0 | 1 | 0 | 0 | 1 |
| 7 | 0 | 0 | 1 | 1 | 0 | 0 | 0 | 1 | 0 | 0 |
| 8 | 0 | 0 | 1 | 1 | 1 | 0 | 1 | 0 | 0 | 1 |
| 9 | 0 | 1 | 0 | 0 | 0 | 0 | 0 | 1 | 0 | 0 |
| 10 | 0 | 1 | 0 | 0 | 1 | 1 | 0 | 0 | 0 | 1 |
| 11 | 0 | 1 | 0 | 1 | 0 | 0 | 0 | 1 | 0 | 0 |
| 12 | 0 | 1 | 0 | 1 | 1 | 1 | 0 | 0 | 0 | 1 |
| 13 | 0 | 1 | 1 | 0 | 0 | 1 | 0 | 0 | 1 | 0 |
| 14 | 0 | 1 | 1 | 0 | 1 | 1 | 0 | 0 | 0 | 1 |
| 15 | 0 | 1 | 1 | 1 | 0 | 0 | 0 | 1 | 0 | 0 |
| 16 | 0 | 1 | 1 | 1 | 1 | 1 | 0 | 0 | 0 | 1 |
| 17 | 1 | 0 | 0 | 0 | 0 | 0 | 0 | 1 | 0 | 0 |
| 18 | 1 | 0 | 0 | 0 | 1 | 0 | 1 | 0 | 0 | 1 |
| 19 | 1 | 0 | 0 | 1 | 0 | 0 | 0 | 1 | 0 | 0 |
| 20 | 1 | 0 | 0 | 1 | 1 | 0 | 1 | 0 | 0 | 1 |
| 21 | 1 | 0 | 1 | 0 | 0 | 0 | 1 | 0 | 1 | 0 |
| 22 | 1 | 0 | 1 | 0 | 1 | 0 | 1 | 0 | 0 | 1 |
| 23 | 1 | 0 | 1 | 1 | 0 | 0 | 0 | 1 | 0 | 0 |
| 24 | 1 | 0 | 1 | 1 | 1 | 0 | 1 | 0 | 0 | 1 |
| 25 | 1 | 1 | 0 | 0 | 0 | 0 | 0 | 1 | 0 | 0 |
| 26 | 1 | 1 | 0 | 0 | 1 | 1 | 0 | 0 | 0 | 1 |
| 27 | 1 | 1 | 0 | 1 | 0 | 0 | 0 | 1 | 0 | 0 |
| 28 | 1 | 1 | 0 | 1 | 1 | 0 | 1 | 0 | 0 | 1 |
| 29 | 1 | 1 | 1 | 0 | 0 | 1 | 0 | 0 | 1 | 0 |
| 30 | 1 | 1 | 1 | 0 | 1 | 1 | 0 | 0 | 0 | 1 |
| 31 | 1 | 1 | 1 | 1 | 0 | 0 | 0 | 1 | 0 | 0 |
| 32 | 1 | 1 | 1 | 1 | 1 | 1 | 0 | 0 | 0 | 1 |

In a preferred embodiment, in addition to the logic shown in FIG. 4, the user configurable circuit 300 contains set/reset logic. The operation of set/reset logic to set the slave latch 355 as is well known in the art. In order to implement the polarity function through the clock logic 410, the set/reset logic is modified. When the polarity select is set to true, and the set/reset logic is enabled, then the set/reset logic sets a high logic level in the slave latch 355. When the polarity select is set to a bar, and the set/reset logic is enabled, then a low logic level is driven in the slave latch 355.

Figure 5:
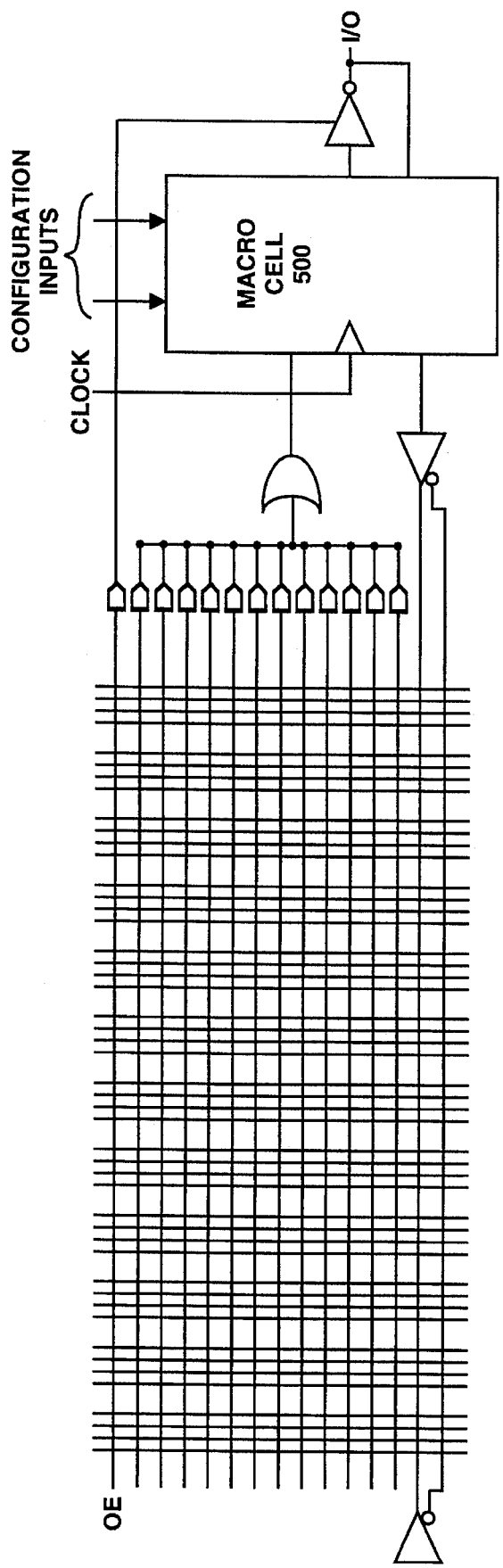
FIG. 5 illustrates a programmable macro cell incorporating the user configurable circuit of the present invention.

The present invention has application for use in a programmable macro cell. FIG. 5 illustrates a programmable macro cell incorporating the user configurable circuit of the present invention. In general, a programmable macro cell 500 is configured in accordance with the user configurable circuit 200 shown in FIG. 2. The macro cell 500 may be configured as having combinatorial or registered outputs. In one embodiment for the registered outputs, the programmable macro cell 500 is configured in accordance with the user configurable circuit 400 to permit a user to select a T-type flip-flop, a D-type flip-flop, or a latch configuration. By using the user configurable circuit of the present invention as a programmable macro cell, the T-type flip-flop and the D-type flip-flop configurations are specified as having equivalent propagation delay times. In addition, the data path is reduced to provide shorter propagation delays for both the T-type flip-flop and the D-type flip-flop configurations.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A circuit comprising:

a plurality of user configurable inputs for configuring said circuit;

clock logic coupled to said user configurable inputs and coupled to receive a clock input, said clock logic for generating conditional clock signals to implement a logic function for said circuit based on said clock input and said user configurable inputs;

a switching element including at least one pass gate coupled to said clock logic to receive some of said conditional clock signals and coupled to receive an input signal for said circuit, said switching element for generating a logic output, in accordance with said conditional clock signals, to implement said logic function by controlling propagation of said input signal through said pass gate; and a data path circuit coupled to receive said logic output and others of said conditional clock signals for providing additional functionality, wherein propagation delay through said switching element to said data path circuit is independent of said user configurable inputs.

2. The circuit as set forth in claim 1, wherein said data path circuit comprises a register.

3. The circuit as set forth in claim 1, wherein said data path circuit comprises a combinatorial circuit.

4. The circuit as set forth in claim 1, wherein said logic function implemented in said clock logic comprises a multiplexer function.

5. The circuit as set forth in claim 1, wherein said logic function implemented in said clock logic comprises a decoder function.

6. The circuit as set forth in claim 4, wherein said multiplexer function comprises multiplexing between a D-type register, T-type register and a latch.

7. The circuit as set forth in claim 1, wherein said logic function, implemented in said clock logic, comprises a polarity function for generating a true or a bar output for said circuit.

8. The circuit as set forth in claim 1, wherein:

said user configurable inputs comprise a D-type register select, a T-type resister select, a latch select and a polarity select;

said logic function implemented in said clock logic comprises a multiplexer function, for selecting among a D-type flip-flop, a T-type flip-flop and a latch, said logic function comprises a toggle function for implementing a T-type flip-flop, and said logic function comprises a polarity function for generating a true or a bar output for said circuit; and said data path circuit comprises a master latch, coupled to receive said logic output, and a slave latch coupling said master latch and said circuit output.

9. The circuit as set forth in claim 8, wherein said switching element comprises:

a three state inverter coupled to said input signal and being controlled by said clock logic for inverting said input data in accordance with said D-type register select, said T-type resister select, and said polarity select; and a transmission gate coupled to said input signal and being controlled by said clock logic for passing said input data in accordance with said D-type register select, said T-type resister select, and said polarity select.

10. A programmable logic device (PLD) comprising:

a plurality of user configurable inputs for configuring said PLD;

at least one macrocell, coupled to receive said user configurable inputs, said macrocell comprising:

clock logic coupled to said user configurable inputs and coupled to receive a clock input, said clock logic for generating conditional clock signals to implement a logic function for said circuit based on said clock input and said user configurable inputs;

a switching element including at least one transmission gate coupled to said clock logic to receive some of said conditional clock signals and coupled to receive an input signal for said circuit, said switching element for generating a logic output, in accordance with said conditional clock signals, to implement said logic function by controlling propagation of said input signal through said transmission gate; and a data path circuit coupled to receive logic output and others of said conditional clock signals for providing additional functionality, wherein propagation delay through said switching element to said data path circuit is independent of said user configurable inputs.

11. The programmable logic device as set forth in claim 10, wherein said data path circuit comprises a register.

12. The programmable logic device as set forth in claim 10, wherein said data path circuit comprises a combinatorial circuit.

13. The programmable logic device as set forth in claim 10, wherein said logic function implemented in said clock logic comprises a multiplexer function.

14. The programmable logic device as set forth in claim 10, wherein said logic function implemented in said clock logic comprises a decoder function.

15. The programmable logic device as set forth in claim 11, wherein said multiplexer function comprises multiplexing between a D-type register, T-type register and a latch.

16. The programmable logic device as set forth in claim 10, wherein said logic function, implemented in said clock logic, comprises a polarity function for generating a true or a bar output for said circuit.

17. The programmable logic device as set forth in claim 10, wherein:

said user configurable inputs comprise a D-type register select, a T-type resister select, a latch select and a polarity select;

said logic function implemented in said clock logic comprises a multiplexer function, for selecting among a D-type flip-flop, a T-type flip-flop and a latch, said logic function comprises a toggle function for implementing a T-type flip-flop, and said logic function comprises a polarity function for generating a true or a bar output for said circuit; and said data path circuit comprises a master latch, coupled to receive said logic output, and a slave latch coupling said master latch and said circuit output.

18. The programmable logic device as set forth in claim 17, wherein said switching element comprises:

a three state inverter coupled to said input signal and being controlled by said clock logic for inverting said input data in accordance with said D-type register select, said T-type resister select, and said polarity select; and a transmission gate coupled to said input signal and being controlled by said clock logic for passing said input data in accordance with said D-type register select, said T-type resister select, and said polarity select.

19. A method for configuring a circuit comprising the steps of:

receiving a plurality of user configurable inputs for configuring said circuit;

receiving a clock input;

generating conditional clock signals to implement a logic function for said circuit based on said clock input and said user configurable inputs;

receiving an input signal for said circuit in a switching element including at least one pass gate;

receiving some of said conditional clock signals in said switching element;

generating a logic output from said switching element, in accordance with said conditional clock signals, to implement said logic function by controlling propagation of said input signal through said transmission gate; and providing a data path circuit coupled to receive said logic output and others of said conditional clock signals for providing additional functionality, wherein propagation delay through said switching element to said data path circuit is independent of said user configurable inputs.

* * * * *

UNITED STATES PATENT AND TRADEMARK OFFICE
CERTIFICATE OF CORRECTION

PATENT NO. : 5,502,403
DATED : 03/26/96
INVENTOR(S) : Lin-Shih Liu, S. Babar Raza, Hagop Nazarian, George M. Ansel Stephen M. Douglass and Jeffrey Scott Hunt It is certified that error appears in the above-identified patent and that said Letters Patent is hereby corrected as shown below:

Title page, item [54] and col. 1, in the title should read --
A HIGH SPEED CONFIGURATION INDEPENDENT PROGRAMMABLE MACROCELL Signed and Sealed this Fifteenth Day of May, 2001

Attest:

NICHOLAS P. GODICI

*Attesting Officer*　　　*Acting Director of the United States Patent and Trademark Office*